United States Patent
Ando et al.

(10) Patent No.: US 10,734,286 B1
(45) Date of Patent: Aug. 4, 2020

(54) MULTIPLE DIELECTRICS FOR GATE-ALL-AROUND TRANSISTORS

(71) Applicant: INTERNATIONAL BUSINESS MACHINES CORPORATION, Armonk, NY (US)

(72) Inventors: Takashi Ando, Tuckahoe, NY (US); Jingyun Zhang, Albany, NY (US); Alexander Reznicek, Troy, NY (US); Choonghyun Lee, Rensselaer, NY (US); Pouya Hashemi, Purchase, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/270,174

(22) Filed: Feb. 7, 2019

(51) Int. Cl.
| | |
|---|---|
| *H01L 21/336* | (2006.01) |
| *H01L 21/70* | (2006.01) |
| *H01L 21/8234* | (2006.01) |
| *H01L 21/324* | (2006.01) |
| *H01L 29/423* | (2006.01) |
| *H01L 27/088* | (2006.01) |
| *H01L 21/8238* | (2006.01) |

(52) U.S. Cl.
CPC .... *H01L 21/823462* (2013.01); *H01L 21/324* (2013.01); *H01L 21/823431* (2013.01); *H01L 21/823437* (2013.01); *H01L 21/823857* (2013.01); *H01L 27/0886* (2013.01); *H01L 29/42364* (2013.01); *H01L 29/42392* (2013.01)

(58) Field of Classification Search
CPC ..... H01L 21/823462; H01L 21/823857; H01L 21/31658–31666; H01L 29/42392
USPC .................. 257/272, 368, 407; 438/288, 660
See application file for complete search history.

(56) References Cited

U.S. PATENT DOCUMENTS

| | | |
|---|---|---|
| 6,388,327 B1 | 5/2002 | Giewont et al. |
| 8,492,228 B1 | 7/2013 | Leobandung et al. |
| 8,941,177 B2 | 1/2015 | Adams et al. |
| 9,536,794 B2 | 1/2017 | Chang et al. |
| 9,935,014 B1 | 4/2018 | Cheng et al. |

(Continued)

OTHER PUBLICATIONS

Chudzik, "High-Performance High-k/Metal Gates for 45mm CMOS and Beyond with Gate-First Processing", 2 pages.

(Continued)

*Primary Examiner* — Calvin Lee
(74) *Attorney, Agent, or Firm* — Tutunjian & Bitetto, P.C.; L. Jeffrey Kelly

(57) ABSTRACT

A method is presented for attaining different gate dielectric thicknesses across a plurality of field effect transistor (FET) devices. The method includes forming interfacial and high-k dielectric layers around alternate semiconductor layers of the plurality of FET devices, pinching off gaps between the alternate semiconductor layers by depositing a high work function capping layer over the plurality of FET devices, selectively removing the high work function capping layer from a first set of the plurality of FET devices, depositing a sacrificial capping layer, with the sacrificial capping layer leaving gaps between the alternate semiconductor layers of the first set of the plurality of FET devices, depositing an oxygen blocking layer, and annealing the plurality of FET devices to create different gate dielectric thicknesses for each of the plurality of FET devices.

17 Claims, 7 Drawing Sheets

(56) References Cited

U.S. PATENT DOCUMENTS

| | | | |
|---|---|---|---|
| 9,997,519 B1 | 6/2018 | Bao et al. | |
| 10,103,065 B1 * | 10/2018 | Mochizuki | H01L 21/82384 |
| 10,410,933 B2 * | 9/2019 | Xie | H01L 21/82384 |
| 10,475,902 B2 * | 11/2019 | Lee | H01L 21/82382 |
| 10,566,245 B2 * | 2/2020 | Kwon | H01L 29/775 |
| 10,566,248 B1 * | 2/2020 | Chanemougame | H01L 21/82387 |
| 10,566,435 B2 * | 2/2020 | Zhang | H01L 29/66439 |
| 10,573,521 B2 * | 2/2020 | Wang | H01L 29/66772 |
| 2014/0099785 A1 | 4/2014 | Mujumdar et al. | |
| 2015/0021699 A1 | 1/2015 | Ando et al. | |
| 2017/0221708 A1 | 8/2017 | Bergendahl et al. | |

OTHER PUBLICATIONS

Guha, "Oxygen Vacancies in High Dielectric Constant Oxide-Semiconductor Films", Physical Review Letters, 98, May 2007, 4 pages.

* cited by examiner

1100

Form interfacial and high-k dielectric layers around alternate semiconductor layers of the plurality of FET devices.
1110

Pinch off gaps between the alternate semiconductor layers by depositing a high work function capping layer over the plurality of FET devices.
1120

The work function capping layer includes ruthenium.
1122

The work function capping layer has a work function value greater than 4.5 eV.
1124

Selectively remove the work function capping layer from a first set of the plurality of FET devices.
1130

Deposit a sacrificial capping layer, with the sacrificial capping layer leaving gaps between the alternate semiconductor layers of the first set of the plurality of FET devices.
1140

Deposit an oxygen blocking layer.
1150

Anneal the plurality of FET devices to create different gate dielectric thicknesses for each of the plurality of FET devices.
1160

Deposit a work function metal layer over the plurality of FET devices having the different gate dielectric thicknesses.
1170

Form a first nanosheet stack for a first device and a second nanosheet stack for a second device.
1210

Remove sacrificial layers from the first and second nanosheet stacks.
1220

Form an interfacial layer/high-k dielectric around alternate semiconductor layers of the first and second devices.
1230

Pinch off gaps between the alternate semiconductor layers by depositing a high work function capping layer.
1240

Selectively remove the work function capping layer from the first device.
1250

Deposit a sacrificial capping layer, with the sacrificial capping layer leaving gaps between the alternate semiconductor layers of the first device.
1260

Deposit an oxygen blocking layer.
1270

Anneal the first and second devices to create different gate dielectric thicknesses for each of the first and second devices.
1280

Deposit a work function metal layer over the first and second devices each having a different gate dielectric thickness.
1290

FIG. 12

MULTIPLE DIELECTRICS FOR GATE-ALL-AROUND TRANSISTORS

BACKGROUND

The present invention relates generally to semiconductor devices, and more specifically, to constructing multiple dielectrics for gate-all-around transistors.

In nanometer scale devices, gate structures are often disposed between fin structures or other conducting structures, such as nanosheets. In many instances, the conducting or semiconducting structures are formed closer together due to scaling with smaller node technology sizes. This can be a limiting factor in the reduction of device size scaling. While fin field effect transistors (finFETs) and/or nanosheets can benefit from tight device-device spacing, these dimensions can limit device scaling. Further, devices needing a thicker dielectric for higher voltage operation are even more limited in the allowable dimensions. Higher voltage devices for input and/or output circuits need thicker gate dielectrics as compared to standard gate devices, which have a lower voltage and can be employed, e.g., in logic devices.

SUMMARY

In accordance with an embodiment, a method is provided for attaining different gate dielectric thicknesses across a plurality of field effect transistor (FET) devices. The method includes forming interfacial and high-k dielectric layers around alternate semiconductor layers of the plurality of FET devices, pinching off gaps between the alternate semiconductor layers by depositing a high work function capping layer over the plurality of FET devices, selectively removing the high work function capping layer from a first set of the plurality of FET devices, depositing a sacrificial capping layer, with the sacrificial capping layer leaving gaps between the alternate semiconductor layers of the first set of the plurality of FET devices, depositing an oxygen blocking layer, and annealing the plurality of FET devices to create different gate dielectric thicknesses for each of the plurality of FET devices.

In accordance with another embodiment, a method is provided for attaining different gate dielectric thicknesses across a plurality of field effect transistor (FET) devices. The method includes forming a first nanosheet stack for a first device and a second nanosheet stack for a second device, removing sacrificial layers from the first and second nanosheet stacks, forming interfacial and high-k dielectric layers around alternate semiconductor layers of the first and second devices, pinching off gaps between the alternate semiconductor layers by depositing a high work function capping layer, selectively removing the high work function capping layer from the first device, depositing a sacrificial capping layer, with the sacrificial capping layer leaving gaps between the alternate semiconductor layers of the first device, depositing an oxygen blocking layer, and annealing the first and second devices to create different gate dielectric thicknesses for each of the first and second devices.

In accordance with yet another embodiment, a semiconductor structure is provided for attaining different gate dielectric thicknesses across a plurality of field effect transistor (FET) devices. The semiconductor structure has a first nanosheet transistor that includes a logic device including alternate semiconductor layers surrounded by an interfacial layer having a first gate dielectric thickness, and an I/O device that includes alternate semiconductor layers surrounded by an interfacial layer having a second gate dielectric thickness. The second gate dielectric thickness is greater than the first gate dielectric thickness.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein:

FIG. 11 is a flow diagram illustrating a method for attaining different gate dielectric thicknesses across a plurality of field effect transistor (FET) devices, in accordance with an embodiment of the present invention; and FIG. 12 is a flow diagram illustrating a method for attaining different gate dielectric thicknesses across a plurality of field effect transistor (FET) devices, in accordance with an embodiment of the present invention.

Throughout the drawings, same or similar reference numerals represent the same or similar elements.

DETAILED DESCRIPTION

Embodiments in accordance with the present invention provide methods and devices for achieving different gate dielectric thickness field effect transistor (FET) devices without degrading logic device performance. Nanosheets provide for viable device architectures in scaling complementary metal oxide semiconductors (CMOS) beyond the 7 nm node. Thin gate dielectric nanosheet transistors can be used, e.g., for logic and static random access memory (SRAM) applications, whereas thick gate dielectric nanosheet transistors can be used, e.g., for high voltage and analog applications.

Embodiments in accordance with the present invention provide methods and devices for achieving different gate dielectric thicknesses for FET devices by employing a pinched off reliability sacrificial layer with different materials to change or alter or adjust the regrowth of the interfacial layer (IL) for the different FET devices. An oxygen blocking layer can be added to one or more of the FET devices to selectively reduce the IL regrowth amount. As a result, formation of multiple oxide nanosheet FETs can be achieved. In particular, two different oxide thicknesses can be achieved for two different FET devices formed on a common substrate by performing anneals with and without a ruthenium (Ru) capping layer.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
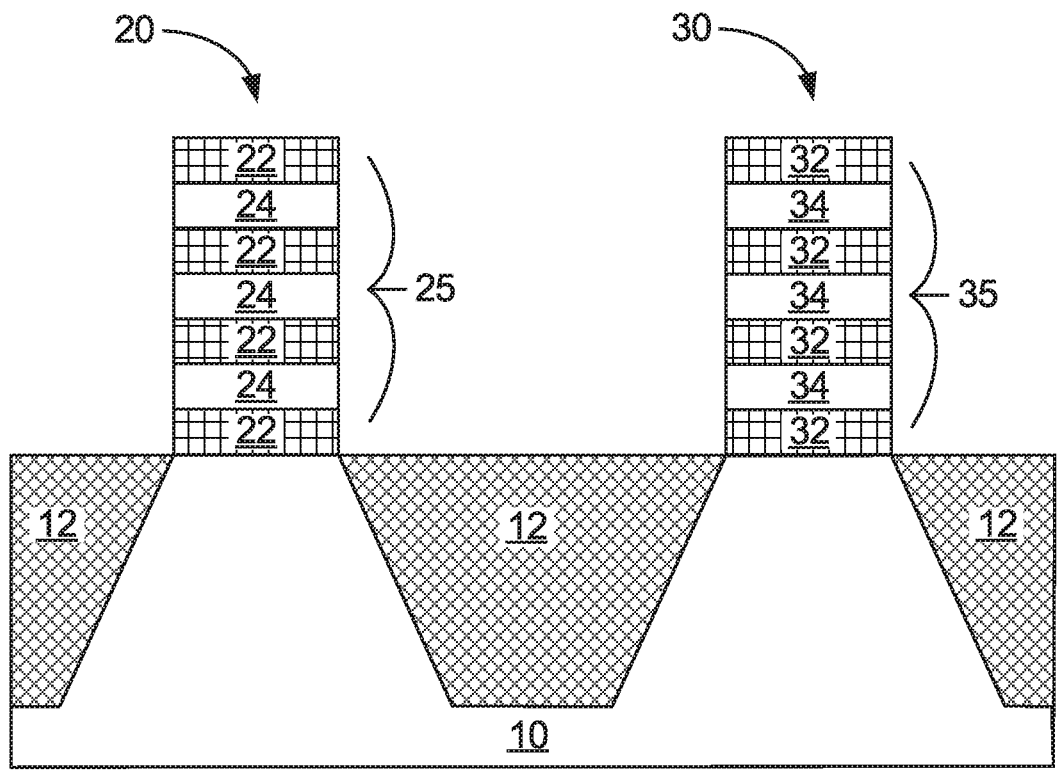
FIG. 1 is a cross-sectional view of a semiconductor structure including multiple nanosheet stacks formed over a substrate, in accordance with an embodiment of the present invention.

FIG. 1 is a cross-sectional view of a semiconductor structure including multiple nanosheet stacks formed over a substrate, in accordance with an embodiment of the present invention.

In various example embodiments, a semiconductor structure includes shallow trench isolation (STI) regions 12 formed within a substrate 10. Multiple field effect transistor (FET) devices 20 and 30 can be formed over the substrate 10. In one example, two FET devices 20 and 30 can be formed over the substrate 10. The FET devices 20 and 30 can be formed by constructing nanosheet stacks. In one example, a first nanosheet stack 25 and a second nanosheet stack 35 are constructed in direct contact with the substrate 10. In one embodiment, the first FET device 20 can be a logic device and the second FET device 30 can be an I/O device.

The first nanosheet stack 25 can include alternating layers of a first semiconductor layer 22 and a second semiconductor layer 24. The first semiconductor layer 22 can be, e.g., silicon germanium (SiGe) and the second semiconductor layer 24 can be, e.g., silicon (Si).

The second nanosheet stack 35 can include alternating layers of a first semiconductor layer 32 and a second semiconductor layer 34. The first semiconductor layer 32 can be, e.g., silicon germanium (SiGe) and the second semiconductor layer 34 can be, e.g., silicon (Si).

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The shallow trench isolation (STI) regions 12 can be formed by etching a trench in doped bottom source/drain (S/D) regions (not shown) utilizing a dry etching process, such as, e.g., reactive ion etching (RIE) or plasma etching. The trenches can optionally be lined with a liner material, e.g., silicon nitride or silicon oxynitride, and then chemical vapor deposition (CVD) or another like deposition process is used to fill the trench with silicon oxide or another like STI dielectric material. The STI dielectric can optionally be densified after deposition. A planarization process, such as, e.g., chemical-mechanical polishing (CMP) can optionally be used to provide a planar structure.

Referring to, e.g., the first nanosheet stack 25, the first semiconductor layer 22 can be the first layer in a stack of sheets of alternating materials. The first nanosheet stack 25 includes first semiconductor layers 22 and second semiconductor layers 24. Although it is specifically contemplated that the first semiconductor layers 22 can be formed from silicon germanium and that the second semiconductor layers 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor layers 22 and 24 can be deposited by any appropriate mechanism. It is specifically contemplated that the semiconductor layers 22 and 24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated. A similar process can be applied to the semiconductor layers 32 and 34 of the second nanosheet stack 35.

Figure 2:
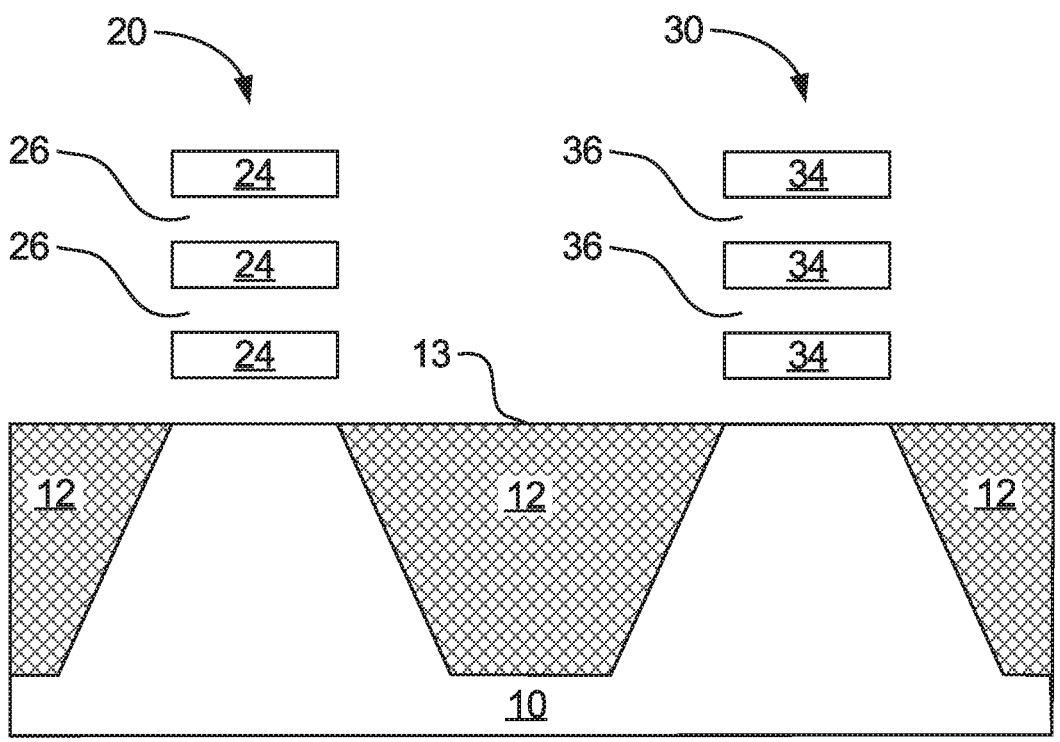
FIG. 2 is a cross-sectional view of the semiconductor structure of FIG. 1 where sacrificial layers of the multiple nanosheet stacks are removed, in accordance with an embodiment of the present invention.

FIG. 2 is a cross-sectional view of the semiconductor structure of FIG. 1 where sacrificial layers of the multiple nanosheet stacks are removed, in accordance with an embodiment of the present invention.

In various example embodiments, the first and second nanosheet stacks 25 and 35 are etched. The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

In some examples, the selective wet etch or the selective dry etch can selectively remove the entire first semiconductor layers 22 and 32 and leave the entire or portions of the second semiconductor layers 24 and 34. The removal creates gaps or openings 26 between the second semiconductor layers 24 of the first FET device 20 and gaps or openings 36 between the second semiconductor layers 34 of the second FET device 30.

The dry and wet etching processes can have etching parameters that can be tuned, such as etchants used, etching temperature, etching solution concentration, etching pressure, source power, radio frequency (RF) bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

The etching also exposes a top surface 13 of the STI regions 12.

Figure 3:
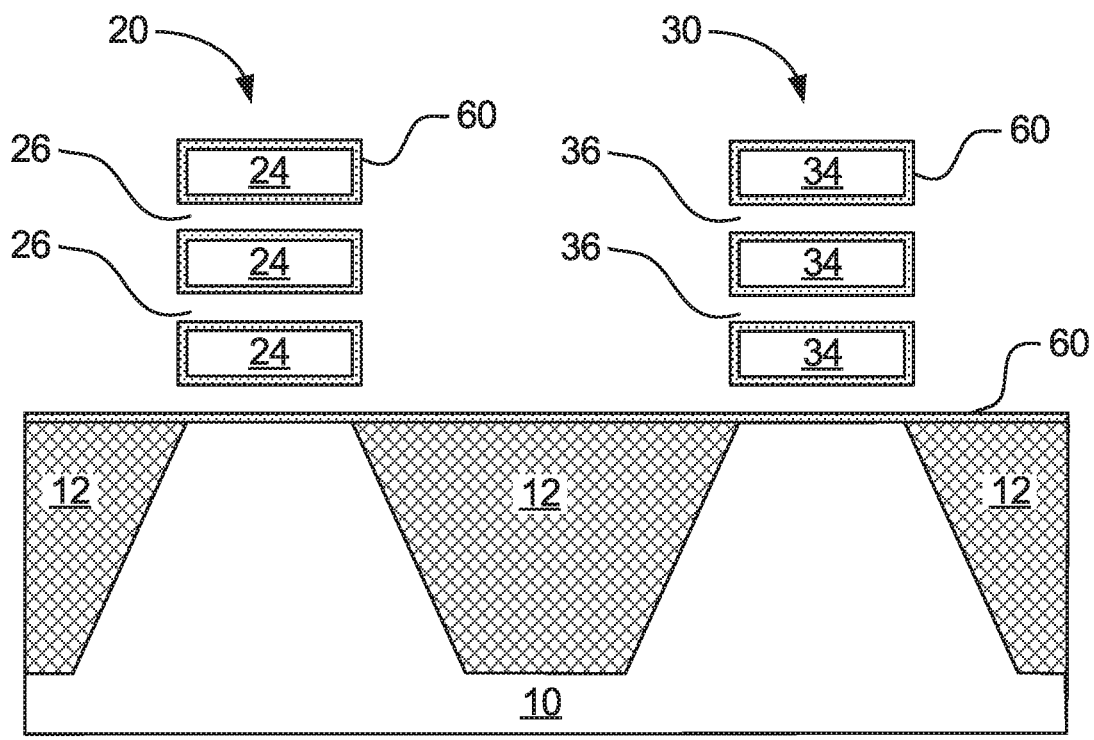
FIG. 3 is a cross-sectional view of the semiconductor structure of FIG. 2 where interfacial and high-k dielectric layers are formed adjacent remaining layers of the multiple nanosheet stacks, in accordance with an embodiment of the present invention.

FIG. 3 is a cross-sectional view of the semiconductor structure of FIG. 2 where interfacial and high-k dielectric layers (IL and HK) are formed adjacent remaining layers of the multiple nanosheet stacks, in accordance with an embodiment of the present invention.

In various example embodiments, interfacial and high-k dielectric layers (IL and HK) 60 are formed around each of the semiconductor layers 24 and 34 of FET devices 20 and 30 respectively.

In some embodiments, an interfacial layer (IL) can be formed to wrap around second semiconductor layers 24 and 34. IL can be deposited by any appropriate method, such as ALD, CVD, and ozone oxidation. IL can include oxide, HfSiO and oxynitride.

A HK dielectric layer can be deposited over and wrapped around IL by any suitable techniques, such as ALD, CVD, metal-organic CVD (MOCVD), physical vapor deposition (PVD), thermal oxidation, combinations thereof, or other suitable techniques. The HK dielectric layer can include, e.g., HfO, LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfTiO, $(Ba,Sr)TiO_3$(BST), $Al_2O_3$, $Si_3N_4$, oxynitrides (SiON), or other suitable materials.

Figure 4:
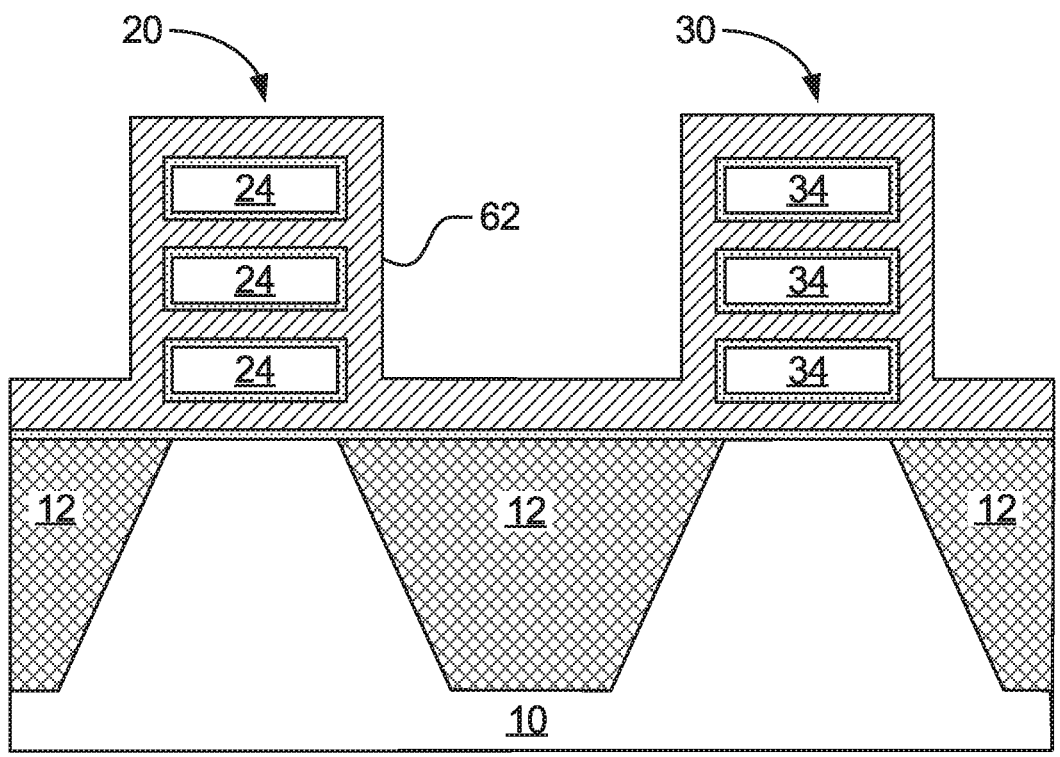
FIG. 4 is a cross-sectional view of the semiconductor structure of FIG. 3 where a high work function capping layer is deposited, in accordance with an embodiment of the present invention.

FIG. 4 is a cross-sectional view of the semiconductor structure of FIG. 3 where a high work function capping layer is deposited, in accordance with an embodiment of the present invention.

In various example embodiments, a high work function capping layer 62 can be formed to wrap around IL and HK 60. The IL thickness can have a linear correlation with the work function value of the high work function capping layer 62. The high work function capping layer 62 with a work function value exceeding the Si midgap can enable more IL growth compared to metals with work function value less than the Si midgap. In one embodiment, the high work function capping layer can have a work function value greater than 4.5 eV. In another embodiment, the high work function capping layer 62 can be, e.g., a ruthenium (Ru) layer. In yet another embodiment, the work function capping layer 62 can be, e.g., an iridium (Ir) layer, a platinum (Pt) layer, or a rhenium (Re) layer. The high work function capping layer 62 is thick enough to pinch off the spacing between the channels. In one example, the thickness of the high work function capping layer 62 can be, e.g., between about 2 nanometers (nm) and about 4 nm.

Ruthenium is a transition metal, which means that ruthenium has an incomplete inner shell that serves as a link between the least and the most electropositive in a series of elements. Like the other members of the platinum family (platinum, rhodium, palladium, iridium, osmium), ruthenium is inert, which means ruthenium will not react when exposed to most chemicals. Ruthenium is extremely hard. It is often used as a hardener for platinum and palladium. Ruthenium also will not tarnish at room temperature, and small amounts of the material can enhance the corrosion resistance of titanium. Ruthenium's hardness makes it an excellent choice for increasing the wear resistance of electrical contacts and resistors, especially when alloyed with other platinum group metals. Ruthenium plating is also used when manufacturing semiconductors. As a refractory metal, ruthenium has a very high melting point (above 2300° C.) and good electromigration resistance.

The high work function capping layer 62 can be formed by, e.g., an ALD process with cycles of alternating exposure steps of a Ru-containing precursor and an O-containing reactant, separated with a purge step in between exposure steps of different reactants, to grow a Ru film. In one embodiment, the high work function capping layer 62 can be formed by an ALD process utilizing a zero-oxidation state liquid precursor, e.g., $\eta^4$-2,3-dimethylbutadiene ruthenium tricarbonyl ($Ru(DMBD)(CO)_3$). The Ru film can be deposited using alternating $N_2$-purge-separated pulses of Ru(DMBD)(CO)$_3$ and $O_2$. The Ru film can be deposited between short (2 s) pulses of $O_2$. The Ru film can have an ALD temperature window from, e.g., 290 to 320° C., with a growth per cycle (GPC) of, e.g., 0.067 nm/cycle, and a negligible nucleation delay on $SiO_2$. The Ru film can show a strong hexagonal crystal structure with low resistivity of approximately, e.g., 14 μΩ cm at 320° C.

Figure 5:
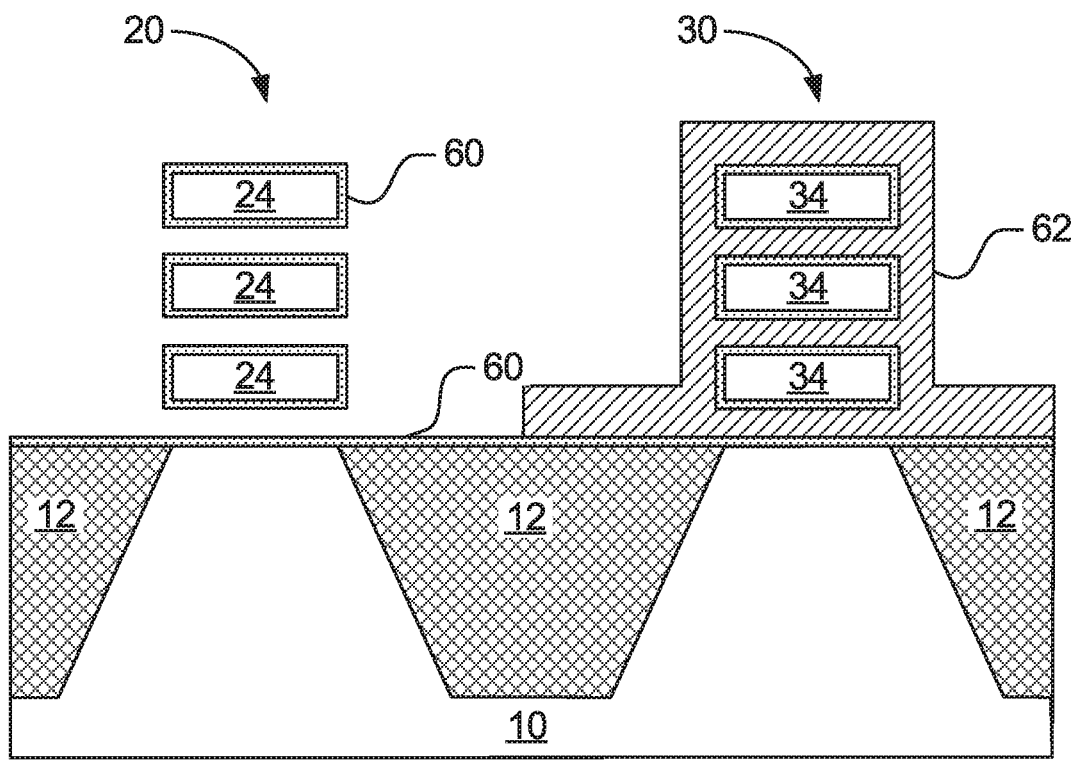
FIG. 5 is a cross-sectional view of the semiconductor structure of FIG. 4 where the high work function capping layer is selectively removed, in accordance with an embodiment of the present invention.

FIG. 5 is a cross-sectional view of the semiconductor structure of FIG. 4 where the high work function capping layer is selectively removed, in accordance with an embodiment of the present invention.

In various example embodiments, the high work function capping layer 62 is selectively removed from the first nanosheet stack 25 of the first FET device 20. The high work function capping layer 62 remains intact over the second nanosheet stack 35 of the second FET device 30. The selective removal of the high work function capping layer 62 can be achieved by etching, such as an RIE etch.

Figure 6:
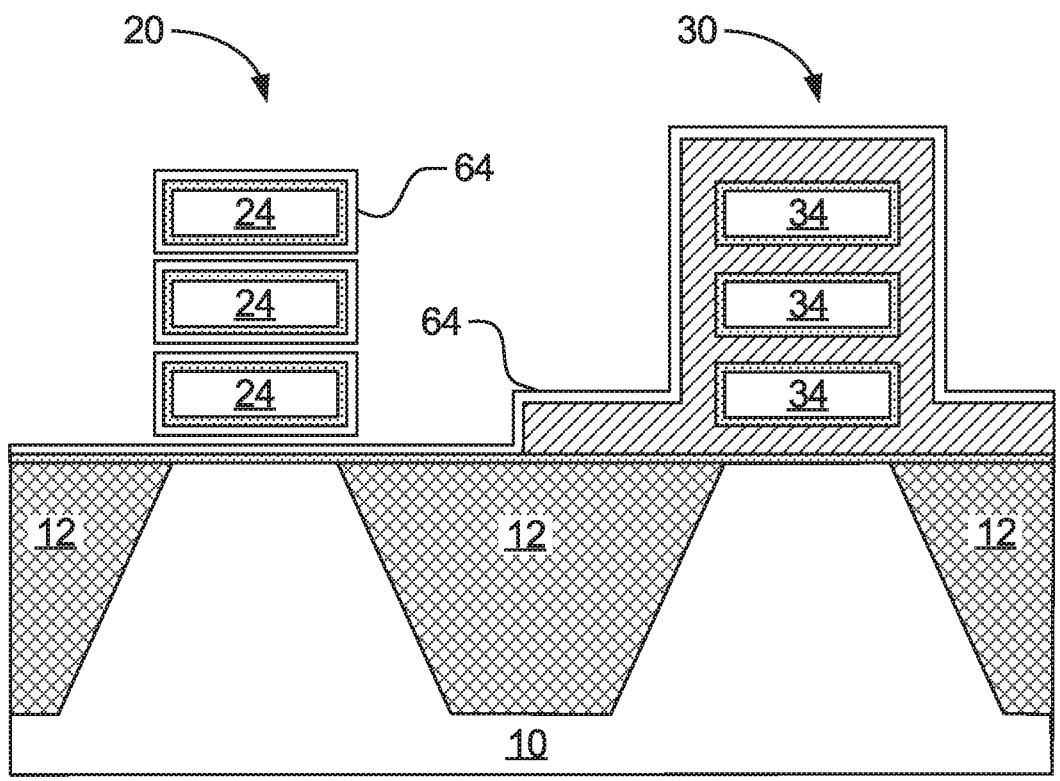
FIG. 6 is a cross-sectional view of the semiconductor structure of FIG. 5 where a sacrificial capping layer is deposited, in accordance with an embodiment of the present invention.

FIG. 6 is a cross-sectional view of the semiconductor structure of FIG. 5 where a sacrificial capping layer is deposited, in accordance with an embodiment of the present invention.

In various example embodiments, a sacrificial capping layer is deposited over all the FET devices 20 and 30. The sacrificial capping layer 64 can be a TiN layer. The sacrificial capping layer 64 is thick enough to pinch off the spacing between the channels. In one example, the thickness of the sacrificial capping layer 64 can be, e.g., between about 2 nm to 4 nm. In one example, the thickness of the sacrificial capping layer 64 can be approximately equal to the thickness of the work function capping layer 62. In another example, the thickness of the sacrificial capping layer 64 can be less than the thickness of the work function capping layer 62.

Figure 7:
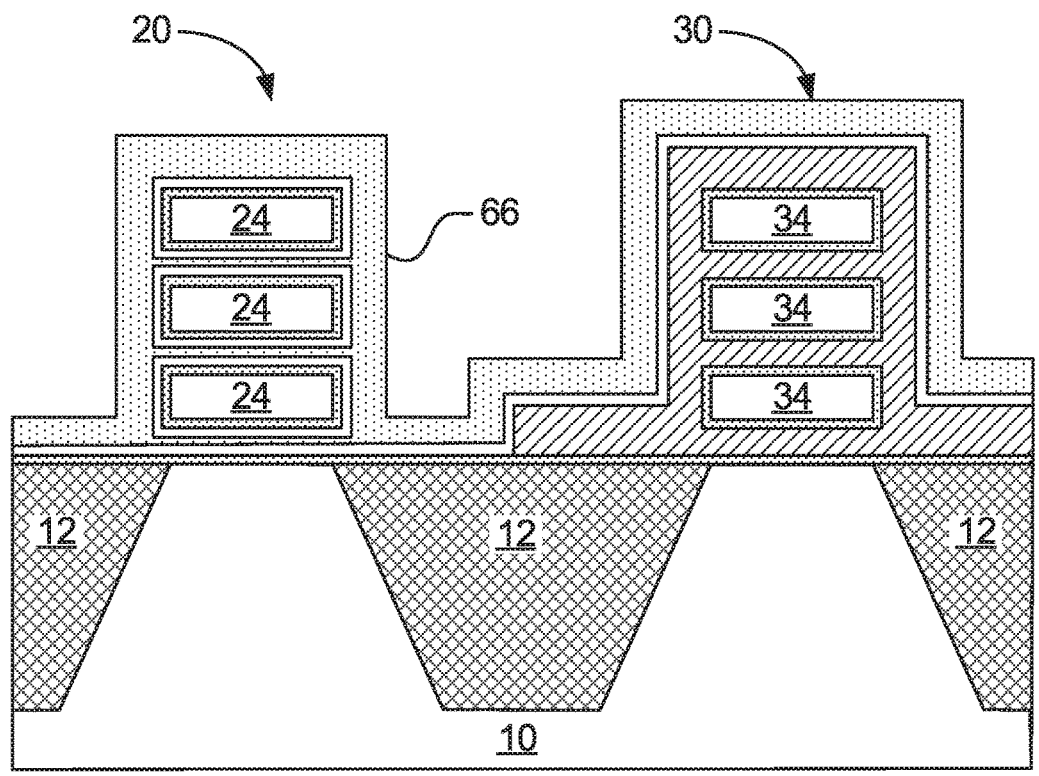
FIG. 7 is a cross-sectional view of the semiconductor structure of FIG. 6 where an oxygen blocking layer is deposited, in accordance with an embodiment of the present invention.

FIG. 7 is a cross-sectional view of the semiconductor structure of FIG. 6 where an oxygen blocking layer is deposited, in accordance with an embodiment of the present invention.

In various example embodiments, an oxygen blocking layer 66 is deposited. The oxygen blocking layer 66 can be, e.g., an amorphous silicon layer.

Figure 8:
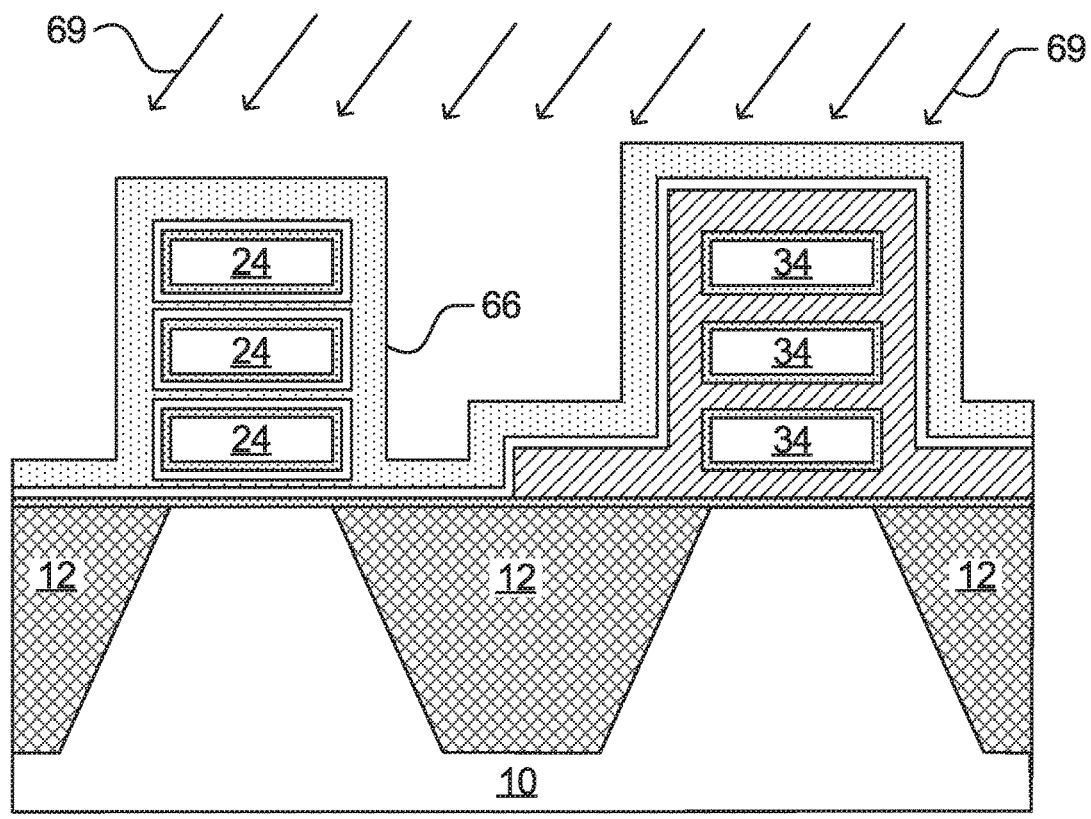
FIG. 8 is a cross-sectional view of the semiconductor structure of FIG. 7 where the oxygen blocking layer is annealed, in accordance with an embodiment of the present invention.

FIG. 8 is a cross-sectional view of the semiconductor structure of FIG. 7 where the oxygen blocking layer is annealed, in accordance with an embodiment of the present invention.

The structure is annealed 69. The anneal 69 can be performed using, e.g., a high-temperature environment, e.g., 800 C to 1200 C. In an exemplary anneal, gas is applied at a temperature of about 950 degrees Celsius for about 5 seconds.

Figure 9:
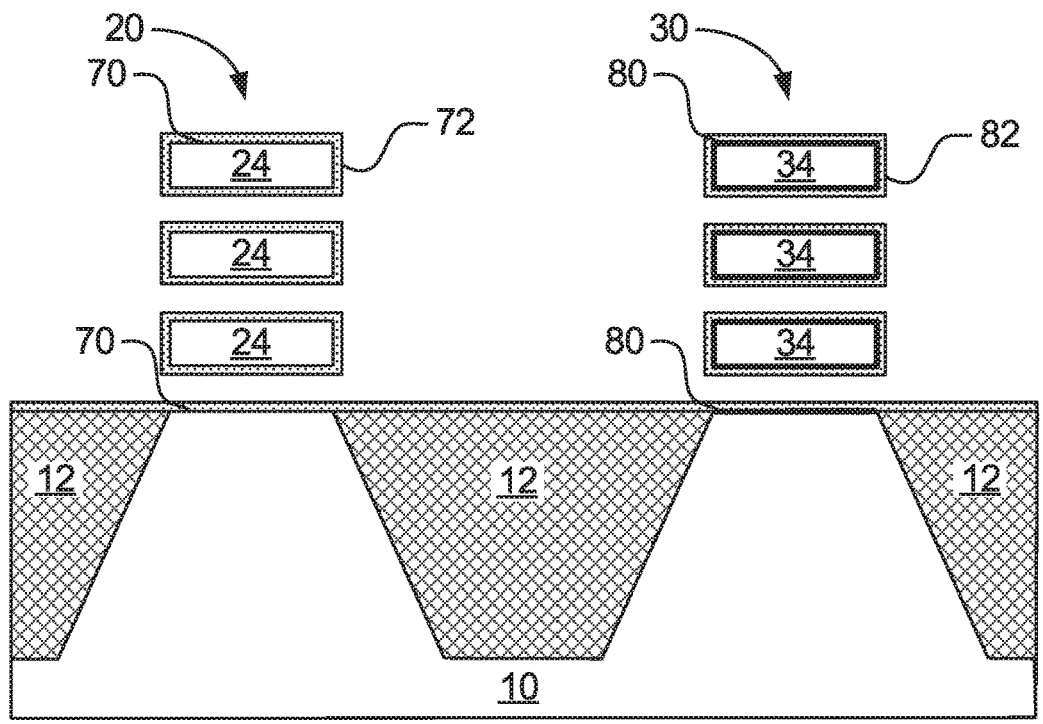
FIG. 9 is a cross-sectional view of the semiconductor structure of FIG. 8 where the IL thickness is different for each of the nanosheet stacks due to different oxygen amounts provided during the anneal, in accordance with an embodiment of the present invention.

FIG. 9 is a cross-sectional view of the semiconductor structure of FIG. 8 where the IL thickness is different for each of the nanosheet stacks due to different oxygen amounts provided during the anneal, in accordance with an embodiment of the present invention.

In various example embodiments, the high work function capping layer 62, the sacrificial capping layer 64, and the oxygen blocking layer 66 are removed and the IL is regrown in different amounts for each of the FET devices 20 and 30. Thus, the IL regrowth amount can be controlled based on the layers formed over each of the first and second nanosheet stacks 20 and 30.

The first FET device 20 is covered by the sacrificial capping layer 64 and the oxygen blocking layer 66. Thus, the sacrificial capping layer and the a-Si layer in combination with the anneal 69 provides for a thin interfacial layer (IL) thickness, $t_1$. In one example, the thickness $t_1$ can be approximately 5 angstrom (Å) to 10 Å. The IL layer 70 has a thickness $t_1$ and the HK layer 72 has a thickness $t_{HK}$.

The second FET device 30 is covered by the high work function capping layer 62, the sacrificial capping layer 64, and the oxygen blocking layer 66. Thus, the Ru cap, the TiN cap, and the a-Si layer in combination with the anneal 69 provides for a thicker IL thickness, $t_2$, where $t_2 > t_1$. In one example, the thickness $t_2$ can be approximately 10 Å to 15 Å. The IL layer 80 has a thickness $t_2$ and the HK layer 82 has a thickness $t_{HK}$. The thickness $t_{HK}$ can be the same for the first and second FET devices 20 and 30.

As a result, the oxide thickness increases from the first and second FET devices 20 and 30. Stated differently, the oxide thickness of the first and second FET devices 20 and 30 can be adjusted. The IL thickness is different between the first and second FET devices 20 and 30 due to the different oxygen amounts provided during the anneal 69. Thus, two different gate dielectric thicknesses can be achieved for two FET devices formed on a common substrate. The two different oxide thicknesses are achieved by performing anneal with and without a Ru capping layer. Thus, the IL thickness of each FET device can be precisely controlled by controlling oxygen amounts provided during the anneal 69. In other words, different sacrificial materials deposited on different FET devices can provide for different supply of oxygen amounts to control interfacial layer regrowth amounts or magnitude.

A very strong correlation can be found between Tiny and the work function capping material. The higher work function material drives a Tiny increase after a high temperature anneal. In one example, a pinched off Ru used as a work function capping material increased Tiny by ~30 Å.

Therefore, the exemplary embodiments of the present invention introduce methods and structures to achieve two different gate dielectric thickness FET devices without degrading logic device performance. Moreover, the exemplary embodiments of the present invention are compatible with the baseline process. The exemplary embodiments of the present invention use pinched off reliability sacrificial layers with different materials to change or alter or adjust or control the regrowth amount of the interface layer or interfacial layer (IL) for different FET devices. By incorporating an oxygen blocking layer, two different oxide thicknesses are achieved for two FET devices. In other words, a pinched off sacrificial capping material in a reliability package is employed, different sacrificial layers provide different amounts of oxygen amount to control IL regrowth amounts, and an oxygen blocking layer is added to control IL regrowth amounts. Thus, the thickness of the IL layers for each FET device can be precisely controlled to desired levels.

Moreover, the exemplary embodiments of the present invention achieve different gate dielectric thicknesses for each of a plurality different FET devices by creating a gate module, selectively removing the sacrificial SiGe layers from the gate module, forming IL and HK layers, depositing a high work function capping layer for reliability package, selectively removing the previous capping layer, depositing a thick sacrificial capping layer for reliability package, depositing an oxygen blocking layer followed by a spike anneal, remove the sacrificial capping layers and the oxygen blocking layer, and performing metallization, that is, gate metal deposition.

Figure 10:
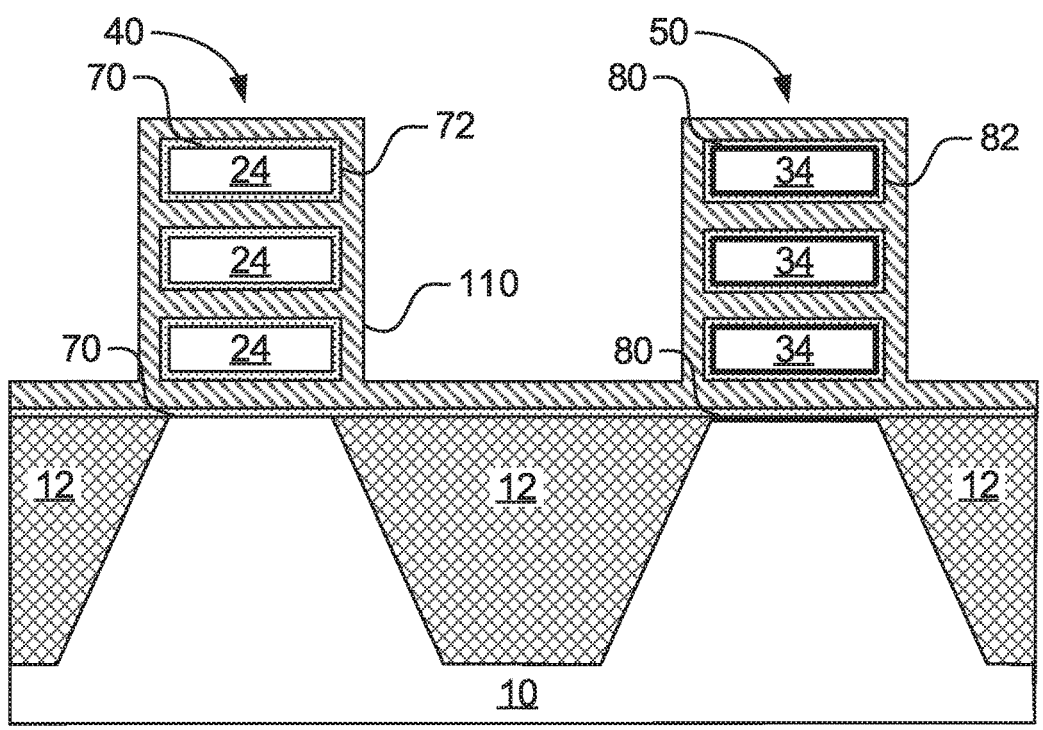
FIG. 10 is a cross-sectional view of the semiconductor structure of FIG. 9 where a metal gate is deposited, in accordance with an embodiment of the present invention.

FIG. 10 is a cross-sectional view of the semiconductor structure of FIG. 9 where a metal gate is deposited, in accordance with an embodiment of the present invention.

In various example embodiments, a work function metal (WFM) 110 can be deposited. The WFM 110 can be metals such as, e.g., titanium nitride (TiN), Titanium carbide (TiC), tantalum nitride (TaN), tantalum carbide (TaC), tungsten (W), aluminum (Al), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, the height of the conductive material 110 can be reduced by chemical-mechanical polishing (CMP) and/or etching. Therefore, the planarization process can be provided by CMP. Other planarization process can include grinding and polishing.

The deposition of the WFM 110 results in a first final FET structure 40 and a second final FET structure 50. In one embodiment, the first final FET structure 40 can be a logic device and the second final FET structure 50 can be an I/O device.

Referring to FIG. 11, methods for attaining different gate dielectric thicknesses across a plurality of field effect transistor (FET) devices are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1110, interfacial and high-k dielectric layers are formed around alternate semiconductor layers of the plurality of FET devices. In block 1120, a high work function capping layer is deposited over the plurality of FET devices pinching off gaps between the alternate semiconductor layers. In block 1122, the high work function capping layer includes ruthenium. In block 1124, the high work function capping layer has a work function value greater than 4.5 eV. In block 1130, the high work function capping layer is selectively removed from a first set of the plurality of FET devices. In block 1140, a sacrificial capping layer is deposited leaving gaps between the alternate semiconductor layers of the first set of the plurality of FET devices. In block 1150, an oxygen blocking layer is deposited. In block 1160, an anneal is preformed to create the different gate dielectric thicknesses for each of the plurality of FET devices. In block 1170, a work function metal layer is deposited over the plurality of FET devices having the different gate dielectric thicknesses.

Referring to FIG. 12, methods for attaining different gate dielectric thicknesses across a plurality of field effect transistor (FET) devices are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1210, a first nanosheet stack is formed for a first device and a second nanosheet stack is formed for a second device. In block 1220, sacrificial layers are removed from the first and second nanosheet stacks. In block 1230, interfacial and high-k dielectric layers are formed around alternate semiconductor layers of the first and second devices. In block 1240, a high work function capping layer is deposited and pinches off gaps between the alternate semiconductor layers. In block 1250, the high work function capping layer is selectively removed from the first device. In block 1260, a sacrificial capping layer is deposited leaving gaps between the alternate semiconductor layers of the first device. In block 1270, an oxygen blocking layer is deposited. In block 1280, an anneal is performed to create different gate dielectric thicknesses for each of the first and second devices. In block 1290, a high work function metal layer is deposited over the first and second devices each having a different gate dielectric thickness.

In some embodiments, the nanosheet stacks can include a thin layer of conducting channel material. For example, in some embodiments, one or more of the nanosheet stacks can include Si, SiGe, Ge, and/or a Group III-V semiconductor material, for example InGaAs, but the inventive concept is not limited thereto. The term "Si nanosheet FET" refers to nanosheet FETs with nanosheets including Si or including a large percentage of Si, for example $Si_xGe_{1-x}$, where x is greater than about 0.3. The term "non-Si nanosheet FET" refers to nanosheet FETs with nanosheets not including Si, for example indium gallium arsenide (InGaAs), or including a small percentage of Si, for example $Si_yGe_{1-y}$, where y is less than about 0.3.

A non-Si nanosheet FET can have a higher channel carrier mobility than an equivalent Si nanosheet FET. The higher channel carrier mobility can result in higher performance. However, the non-Si nanosheet FET can also have higher band-to-band tunneling (BTBT) leakage current than the equivalent Si nanosheet FET. In general, high BTBT leakage current can occur in the same device design range as high channel carrier mobility. Several factors can induce higher BTBT leakage current in a non-Si nanosheet FET. For example, a parasitic-bipolar-effect (PBE) can effectively multiply a BTBT leakage current by a large value for non-Si nanosheet FETs with nanosheets including $Si_yGe_{1-y}$, where y is less than about 0.3, to result in a net BTBT-induced leakage current that is significantly high.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for attaining different gate dielectric thicknesses across a plurality of field effect transistor (FET) devices (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for attaining different gate dielectric thicknesses across a plurality of field effect transistor (FET) devices, the method comprising:
   forming interfacial and high-k dielectric layers around alternate semiconductor layers of the plurality of FET devices;
   pinching off gaps between the alternate semiconductor layers by depositing a high work function capping layer over the plurality of FET devices;
   selectively removing the high work function capping layer from a first set of the plurality of FET devices;
   depositing a sacrificial capping layer, with the sacrificial capping layer leaving gaps between the alternate semiconductor layers of the first set of the plurality of FET devices;
   depositing an oxygen blocking layer; and annealing the plurality of FET devices to create different gate dielectric thicknesses for each of the plurality of FET devices.

2. The method of claim 1, wherein each of the plurality of FET devices attains a different gate dielectric thickness based on a different oxygen amount provided during the annealing.

3. The method of claim 1, further comprising depositing a high work function metal layer over the plurality of FET devices having the different gate dielectric thicknesses.

4. The method of claim 1, wherein the alternate semiconductor layers of the plurality of FET devices are silicon (Si) layers.

5. The method of claim 1, wherein the high work function capping layer has a work function value greater than 4.5 eV.

6. The method of claim 1, wherein the high work function capping layer includes ruthenium.

7. The method of claim 1, wherein the oxygen blocking layer includes amorphous silicon (a-Si).

8. The method of claim 1, wherein the plurality of FET devices includes a first FET device and a second FET device.

9. The method of claim 8, wherein the gate dielectric thicknesses of the first and second FET devices are successively larger.

10. A method for constructing devices with different gate dielectric thicknesses, the method comprising:
   forming a first nanosheet stack for a first device and a second nanosheet stack for a second device;
   removing sacrificial layers from the first and second nanosheet stacks;
   forming interfacial and high-k dielectric layers around alternate semiconductor layers of the first and second devices;
   pinching off gaps between the alternate semiconductor layers by depositing a high work function capping layer;
   selectively removing the high work function capping layer from the first device;
   depositing a sacrificial capping layer, with the sacrificial capping layer leaving gaps between the alternate semiconductor layers of the first device;
   depositing an oxygen blocking layer; and
   annealing the first and second devices to create different gate dielectric thicknesses for each of the first and second devices.

11. The method of claim 10, further comprising depositing a high work function metal layer over the first and second devices each having a different gate dielectric thickness.

12. The method of claim 10, wherein the first device and the second device attain different gate dielectric thickness based on a different oxygen amount provided during the anneal.

13. The method of claim 10, wherein the sacrificial layers of the first and second nanosheet stacks are silicon germanium (SiGe) layers.

14. The method of claim 10, wherein the gate dielectric thicknesses of the first and second devices are successively larger.

15. The method of claim 10, wherein the high work function capping layer has a work function value greater than 4.5 eV.

16. The method of claim 10, wherein the oxygen blocking layer includes amorphous silicon (a-Si).

17. The method of claim 10, wherein the high work function capping layer includes ruthenium.

\* \* \* \* \*